US008954197B2

(12) United States Patent (10) Patent No.: US 8,954,197 B2
Pienta et al. (45) Date of Patent: Feb. 10, 2015

(54) ARRANGEMENT FOR OPERATING A DATA CENTER USING BUILDING AUTOMATION SYSTEM INTERFACE

(75) Inventors: William Thomas Pienta, Prospect Heights, IL (US); Pornsak Songkakul, Mequon, WI (US)

(73) Assignee: Siemens Industry, Inc., Alpharetta, GA (US)

( * ) Notice: Subject to any disclaimer, the term of this patent is extended or adjusted under 35 U.S.C. 154(b) by 1005 days.

(21) Appl. No.: 12/436,072

(22) Filed: May 5, 2009

(65) Prior Publication Data

US 2009/0276095 A1 Nov. 5, 2009

Related U.S. Application Data

(60) Provisional application No. 61/050,425, filed on May 5, 2008, provisional application No. 61/050,429, filed on May 5, 2008, provisional application No. 61/050,420, filed on May 5, 2008.

(51) Int. Cl.
| | |
|---|---|
| G05B 21/00 | (2006.01) |
| G05D 3/12 | (2006.01) |
| G06F 15/16 | (2006.01) |
| G06F 11/00 | (2006.01) |
| G06F 1/20 | (2006.01) |
| G06F 9/50 | (2006.01) |
| H05K 7/20 | (2006.01) |

(52) U.S. Cl.
CPC .............. *G06F 1/206* (2013.01); *G06F 9/505* (2013.01); *G06F 9/5094* (2013.01); *H05K 7/20836* (2013.01)
USPC ........... 700/277; 700/291; 709/226; 709/227; 709/233; 702/188

(58) Field of Classification Search
USPC .............. 700/277, 291; 709/226, 233, 227; 702/188
See application file for complete search history.

(56) References Cited

U.S. PATENT DOCUMENTS

| | | | | |
|---|---|---|---|---|
| 5,390,206 | A  * | 2/1995 | Rein et al. | 375/130 |
| 6,112,237 | A | 8/2000 | Donaldson | |
| 7,148,825 | B2 * | 12/2006 | Jiang | 341/97 |
| 7,197,433 | B2 * | 3/2007 | Patel et al. | 702/188 |
| 7,210,048 | B2 * | 4/2007 | Bodas | 713/320 |
| 7,676,280 | B1 * | 3/2010 | Bash et al. | 700/17 |
| 7,694,159 | B2 * | 4/2010 | Cepulis | 713/310 |
| 8,001,403 | B2 * | 8/2011 | Hamilton et al. | 713/320 |
| 8,035,320 | B2 * | 10/2011 | Sibert | 315/312 |
| 8,447,993 | B2 * | 5/2013 | Greene et al. | 713/300 |

(Continued)

FOREIGN PATENT DOCUMENTS

JP 2000274772 A * 10/2000

*Primary Examiner* — Darrin Dunn

(57) ABSTRACT

An arrangement includes a computer server management system, a data management station of a building environmental control system and a data interface therebetween. The computer server management system is configured to coordinate the usage of a plurality of server computers, the computer server management system executing virtualization software configured to manage application processing on the plurality of server computers located in at least one data center. The data management station is operably coupled to controllers, sensors and actuators of the building environmental control system. The data management station is configured to provide at least some data via the data interface to the computer server management data system.

15 Claims, 4 Drawing Sheets

(56) References Cited

U.S. PATENT DOCUMENTS

| | | |
|---|---|---|
| 2003/0050917 A1 | 3/2003 | Charron |
| 2003/0078677 A1* | 4/2003 | Hull et al. .......................... 700/1 |
| 2003/0193777 A1* | 10/2003 | Friedrich et al. .............. 361/687 |
| 2003/0232288 A1* | 12/2003 | Oka et al. ....................... 430/350 |
| 2004/0163001 A1* | 8/2004 | Bodas .......................... 713/300 |
| 2005/0192915 A1 | 9/2005 | Ahmed |
| 2005/0228618 A1 | 10/2005 | Bash |
| 2006/0047808 A1* | 3/2006 | Sharma et al. ................. 709/224 |
| 2006/0161307 A1 | 7/2006 | Bash |
| 2006/0184287 A1 | 8/2006 | Belady |
| 2006/0259622 A1* | 11/2006 | Moore et al. ................... 709/226 |
| 2007/0124684 A1* | 5/2007 | Riel et al. ....................... 715/736 |
| 2007/0213881 A1* | 9/2007 | Belady et al. .................. 700/300 |
| 2007/0232288 A1* | 10/2007 | McFarland et al. ............ 455/423 |
| 2007/0260417 A1* | 11/2007 | Starmer et al. ................ 702/136 |
| 2008/0222416 A1* | 9/2008 | Kiwimagi et al. ............. 713/171 |
| 2008/0301279 A1* | 12/2008 | Brey et al. ...................... 709/224 |
| 2009/0019201 A1* | 1/2009 | Chainer et al. ................ 710/107 |
| 2009/0050703 A1* | 2/2009 | Lifson et al. ..................... 236/51 |
| 2009/0055665 A1* | 2/2009 | Maglione et al. .............. 713/320 |
| 2009/0113323 A1* | 4/2009 | Zhao et al. ..................... 715/764 |
| 2009/0187782 A1* | 7/2009 | Greene et al. ................. 713/340 |

* cited by examiner

ARRANGEMENT FOR OPERATING A DATA CENTER USING BUILDING AUTOMATION SYSTEM INTERFACE

This application claims the benefit of U.S. Provisional Application Ser. No. 61/050,425 filed May 5, 2008, U.S. Provisional Application Ser. No. 61/050,429, filed May 5, 2008, and U.S. Provisional Application Ser. No. 61/050,420, filed May 5, 2008, all of which are incorporated herein by reference.

CROSS-REFERENCE TO RELATED APPLICATIONS

This application is related to our co-pending U.S. patent application Ser. Nos. 12/435,388 and 12/435,401, each filed May 4, 2009, and each of which are incorporated herein by reference.

FIELD OF THE INVENTION

The present invention relates generally to data processing centers, and more particularly, to the management of the operations of a data processing center.

BACKGROUND OF THE INVENTION

Data centers are parts of buildings or facilities in which a large number of server computers are located. The dense packing of the server computers results in the generation of a large amount of heat in a localized area. The data center must be cooled in a reliable manner in order to avoid the shutting down of, or damage to, the server computer hardware. Shutting down of server computers due to heat overload can cause significant economic loss.

Accordingly, specialized cooling units have been developed for implementation directly in data centers. These specialized cooling units are sometimes known in the art as computer room air conditioning units ("CRACs") or computer room air handling units. In this disclosure, air conditioning unit or CRAC will be understood to encompass any device used to effect cooling in a data center. CRACs have been employed as a result of the fact that the ordinary HVAC systems of buildings are not optimally configured to handle the concentrated head generated with data centers. Thus, CRACs are often used in connection with, but in addition to, the ordinary cooling units of a building employed for human comfort systems.

Many CRACs have simple, embedded controls that adjust the unit output based on factors such as sensed ambient air temperature. In some cases, CRACs have controllers that interact with the building automation system that controls or includes the building HVAC system, among other things.

While CRACs provide a solution to the need for enhanced cooling power within a data center having several server computers, there is nevertheless a danger of overheating, due to imbalanced loading of processing tasks within the data center, malfunction or inefficiency of a CRAC unit, or local conditions within the data center that affects the ability to cool certain servers or groups of servers. It is therefore desirable to reduce the risk of overheating or other malfunction of one or more processors in a data center. There is also a need to improve the efficiency in energy consumption in data centers attributable to cooling.

SUMMARY

The present invention addresses the above identified needs, as well as others, by providing an architecture in which a building automation system and data centers share information to coordinate the use of server resources and thermal cooling resources more efficiently.

A first embodiment is an arrangement that includes a computer server management system, a data management station of a building environmental control system and a data interface therebetween. The computer server management system is configured to coordinate the usage of a plurality of server computers, the computer server management system executing virtualization software configure to manage application processing on the plurality of server computers located in at least one data center. The data management station is operably coupled to controllers, sensors and actuators of the building environmental control system. The data management station is configured to provide at least some data via the data interface to the computer server management data system.

The above described features and advantages, as well as others, will become readily apparent to those of ordinary skill in the art by reference to the following detailed description and accompanying drawings.

DETAILED DESCRIPTION

Figure 1:
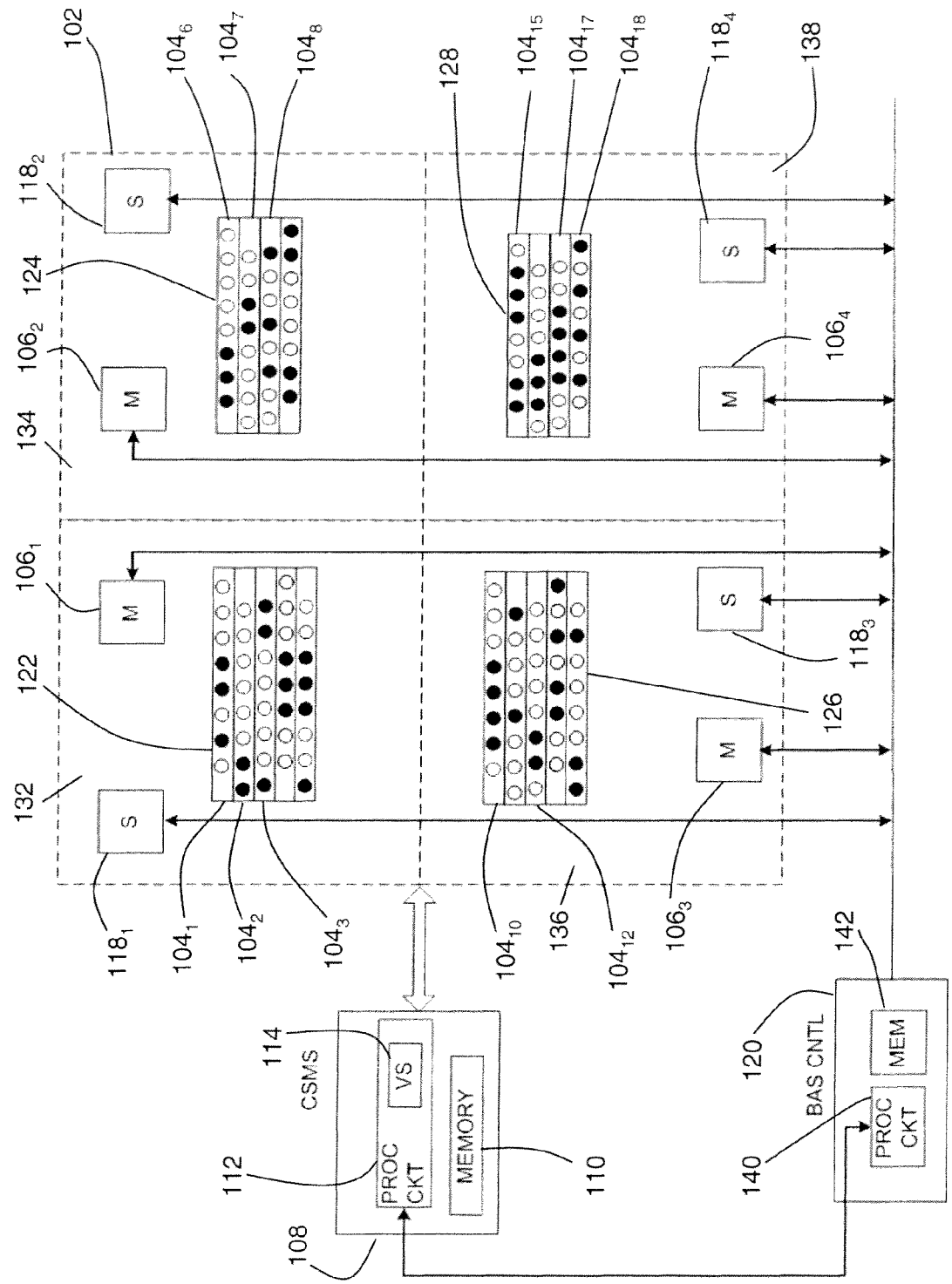
FIG. 1 shows a schematic block diagram of an exemplary arrangement according to a first embodiment of the invention implemented to coordinate application processing in an exemplary data center.

FIG. 1 shows an arrangement 100 according to an exemplary embodiment of the invention. The arrangement 100 is shown used in conjunction with a data center 102 that includes a plurality of server computers $104_1, 104_2 \ldots 104_{18}$ and a plurality of air conditioning units $106_1, 106_2, 106_3$, and $106_4$. The arrangement 100 includes a computer server management system 108 having, among other things, a memory 110 and a processing circuit 112. In this embodiment, the arrangement 100 further includes a BAS element 120, which is communicatively connected to the processing circuit 112.

Each of the server computers $104_1$ to $104_{18}$ is part of a set of computers that provide application processing services to at least one, and typically a large number of, client computers, not shown. The server computers $104_1$ to $104_{18}$ are typically arranged in racks and dispersed throughout the space of the data center 102. For example, as shown in FIG. 1, the server computers $104_1, 104_2, 104_3, 104_4$, and $104_5$ may be grouped on a first rack 122 of a first space 132 of the data center 102. Similarly, the server computers $104_6, 104_7, 104_8$ and $104_9$ may be grouped on a second rack 124 in a second space 134 of the data center 102, the server computers $104_{10}, 104_{11}, 104_{12}, 104_{13}$ and $104_{14}$ may be grouped on a third rack 126 of the third space 136 of the data center 102, and the server computers $104_{15}, 104_{16}, 104_{17}$ and $104_{18}$ may be grouped on a fourth rack 128 of a fourth space 138 of the data center 102.

It will be appreciated that data centers may have more servers per rack, more racks located in a single space, and more defined spaces. In other words, the basic structure of the data center 102 may be expanded (or even reduced) an a nearly infinite number of ways. The principles described in connection with the exemplary embodiment may readily be expanded to such other-sized data centers.

Each of the air conditioning units $106_1$, $106_2$, $106_3$, and $106_4$, is a computer room air conditioner or computer room air handler unit, collectively referred to as CRAC. The air conditioning units $106_1$, $106_2$, $106_3$, and $106_4$ may also be any air conditioning unit that is employed to specifically cool space within a data center or other area that is a high heat generator. Such devices are well known in the art. In this embodiment, each of the air conditioning units $106_1$, $106_2$, $106_3$, and $106_4$ is operably coupled the BAS element 120 such that the BAS element 120 can perform at least some measure of control over the operations of the air conditioning unit $106_n$. For example, if an air conditioning unit $106_n$ has self-contained temperature sensing and control, the BAS element 120 may be operably connected to override the on/off local control, and/or to provide a set point to the air conditioning unit $106_n$. Other air conditioning units may be configured for direct external control. In either event, the BAS element 120 preferably is operably connected to provide overall management and/or control of the each of the air conditioning units $106_1$, $106_2$, $106_3$, and $106_4$.

In the embodiment described herein, the air conditioning units $106_1$, $106_2$, $106_3$, and $106_4$ operate to cool, respectively, spaces 132, 134, 136 and 138. It is known in the art to position air conditioning equipment in a data center in order to focus the cooling capabilities of different air conditioning units on different spaces, even if the various spaces are not physically walled off. By way of example, it is known to arrange air conditioning units to form hot aisles and cool aisles, wherein the air conditioning units are specifically associated with respective cool aisles.

The BAS element 120 is one or more devices that are configured to communicate with, and operate within, a building automation system such as an HVAC system or the like. Such systems are known in the art and may have a general architecture of the APOGEE™ system available from Siemens Building Technologies Inc. The BAS element 120 includes at least one processing circuit 140 and a memory 142. The BAS element 120 may suitably take the form of a supervisory work station in a BAS such as the INSIGHT™ work station available from Siemens Building Technologies, Inc., of Buffalo Grove, Ill. In the alternative, the BAS element 120 may suitably be a configurable field controller, such as the PXC Modular field controller, also available from Siemens Building Technologies, Inc. In general, the processing circuit 140 is configured via other circuits to communicate BAS data (such as set points, sensor values, and commands) with other BAS devices such as other controllers, or even with sensors and actuators. The BAS element 120 may further includes special digital or analog I/O devices as may be necessary to communicate with control elements of the air conditioning units $106_1$, $106_2$, $106_3$, and $106_4$. In this embodiment, the BAS element 120 is further operably connected to communicate information with the computer server management system 108, and particularly the processing circuit 112. To this end, a suitable data interface is provided between the BAS element 120, which is configured for a BAS system, and the computer server management system 108, which is typically not set up for communication with a BAS system.

In the embodiment described herein, the BAS element 120 is configured to monitor environmental conditions within the data center 102, and particularly, in the spaces 132, 134, 136 and 138. To this end, the BAS element 120 is operably coupled to one or more environmental sensors $118_1$ located in the first space 132, one or more environmental sensors $118_2$ located in the second space 134, one or more environmental sensors $118_3$ located in the third space 136, and one or more environmental sensors $118_4$ located in the fourth space 138.

Each of the one or more sensors $118_1$ to $118_4$ may include at least one temperature sensor, as well as, optionally, humidity, air-flow, and/or pressure sensors. The sensors $118_1$ to $118_4$ are configured to provide information regarding environmental conditions in the spaces 132, 134, 136 and 138 to the BAS element 120. Such information may be used both for controlling the operation of the air conditioning units $106_1$, $106_2$, $106_3$, and $106_4$, as well as for determining the suitability of the spaces 132, 134, 136 and 138 for additional processing by server computers therein, as will be discussed below.

The computer server management system 108 is a computing system that is generally configured to coordinate the usage of the plurality of server computers $104_1$ to $104_{18}$. Such devices are generally known. To coordinate the server usage, the processing circuit 112 of the computer server management system 108 executes virtualization software 114. Virtualization software 114, as is known in the art, is software that, when executed by a computer processor otherwise properly configured, manages the allocation of application processes among a plurality of server computers, such as in a data center.

In accordance with this embodiment of the present invention, the processing circuit 112 is further configured to employ the virtualization software 114 to allocate application processes among the server computers $104_1$, $104_2$, etc. based on a measure of the suitability of the spaces 132, 134, 136 and 138. To this end, the memory 110 stores a space information value for each of a plurality of spaces 132, 134, 136 and 138. The space information value includes information regarding the relative suitability of a corresponding space for accepting computing load. The relative suitability of a space can be determined based on at least one environmental condition measurement for the corresponding space, as well as other factors. Further information regarding the development of space information values and/or suitability ratings is discussed further below in connection with FIGS. 2 and 3.

Referring again to FIG. 1, the computer server management system 108 is configured to allocate (via the virtualization software) one or more processing tasks to one of the plurality server computers $104_1$ to $104_{18}$ based in part on the relative suitability of the space in which the server computers $104_1$ to $104_{18}$ are located.

In particular, when an application is assigned to a server computer $104_n$, the execution of the application causes that server computer $104_n$ generate heat energy. The processing circuit 112 allocates the processing tasks such that the heat generated by the server computers 104 executing the processing tasks is distributed to a space in which the environment (and other factors) are in a condition amenable to accept further computational and thermal load.

To this end, it will be appreciated that server computers $104_1$ to $104_5$ generate heat in the space 132, server computers $104_6$ to $104_9$ generate heat in the space 134, computers $104_{10}$ to $104_{14}$ generate heat in the space 136, computers $104_{15}$ to $104_{18}$ generate heat in the space 138. If servers within a particular space are heavily utilized, and/or if the temperature in one or more spaces is particularly high, and/or the temperature is hard to reduce, then such a space would be less suitable (i.e. has a lower relative suitability) for additional computational activity relative to other spaces.

Accordingly, the processing circuit 112 allocates the processing tasks by favoring allocations of computational load to server computers 104 within spaces having a relatively high suitability index.

By way of example, consider a situation in which 100 applications must be allocated to the server computers $104_1$ to $104_{18}$. In the prior art, one way to allocate the applications may be to simply allocate a substantially an equal number of applications to each of the processors, such that in this example each of the server computers $104_1$ to $104_{18}$ would have five or six of the one hundred applications. Alternatively, the allocation may be based on attempting to keep the busyness of each of the server computers $104_1$ to $104_{18}$ roughly equal. Thus, if a particular server computer $104_n$ has a number of particularly computationally intensive tasks, it may have fewer overall applications. The computing speed and efficiency of the server computers $104_1$ to $104_{18}$ may also be taken into account. In any event, the prior art allocation attempts to evenly distribute the computational load.

However, it may be the case that such an allocation according to the prior art would create heat stress in a particular space 136, possibly leading to an unplanned shutdown or at least an alarm condition, while another space 132 is running cool. In such a case, it is advantageous to more heavily load some of the set of server computers $104_1$ to $104_5$ with the additional applications, and to more lightly load the server computers $104_{10}$ to $104_{14}$. Such an allocation distributes more heat to the cooler space 132 and less additional heat to the hotter space 136.

The processing circuit 112 thus determines the allocation of at least some processes based on the space information value (and the suitability index thereof) for each of the spaces 132, 134, 136 and 138.

In the general operation of FIG. 1, the server computers $104_1$ to $104_{18}$ provide application processing to client computers, not shown. The computer server management system 108 operates to assign application requests from clients to one or more of the server computers $104_1$ to $104_{18}$. Once the application requests are assigned to a server computer $104_n$, the server computer $104_n$ thereafter executes the application.

As each server computer $104_n$ executes applications, the microprocessor (and other circuitry) of the server computer generates heat, tending to warm the space around the server computer $104_n$. Thus, in this example, the computational operations of server computers $104_1$ to $104_5$ tend to generate heat in the space 132, the computational operations of server computers $104_6$ to $104_9$ tend to generate heat in the space 134, the computational operations of server computers $104_{10}$ to $104_{14}$ tend to generate heat in the space 136, and the computational operations of server computers $104_{15}$ to $104_{18}$ tend to generate heat in the space 138.

Because excessive heat can damage circuitry, cooling is necessary within the data center 102. In this example, the air conditioning units $106_1$, $106_2$, $106_3$, $106_4$ operate to cool, respectively, spaces 132, 134, 136 and 138. Each of the air conditioning units $106_1$, $106_2$, $106_3$, $106_4$ may suitably operate to cool its respective local space to a predetermined set point temperature. In this embodiment, the BAS element 120 can provide a set point temperature to each of the air conditioning units $106_1$, $106_2$, $106_3$, $106_4$, and can further control at least some aspects of the operation of the air conditioning units $106_1$, $106_2$, $106_3$, $106_4$.

The sensors $181_1$ to $118_4$ operate to provide temperature measurements, and optionally other environmental data, about the respective spaces 132 to 138, to the BAS element 120. Such measurement information is in some cases used to assist in the control of the air conditioning units $106_1$, $106_2$, $106_3$, $106_4$. In accordance with at least some embodiments of the invention, such measurement information is further used to generate a space information value (e.g. a suitability index value).

With respect to the space information value, the BAS element 120 obtains the environmental sensor data received from the sensors $118_1$ to $118_4$. The processing circuit 140 of the BAS element 120 uses the received environmental sensor data regarding the spaces 132, 134, 136 and 138, as well as other information, to generate a suitability index. The other information that the processing circuit 140 may use to generate the suitability index includes computational loading (and forecasted loading) of the server computers within each space 132, 134, 136 and 138. The processing circuit 140 may suitably receive such computational loading and forecasted loading from (or at least through) the processing circuit 112, which should have access to such information.

In any event, the processing circuit 140 thus generates a space information value, which in this case includes a suitability index calculated based on at least environmental information, for each of the spaces 132, 134, 136 and 138. The processing circuit 140 provides the space information values to the processing circuit 112 of the computer server management system 108. The processing circuit 112 stores the suitability index for the spaces 132, 134, 136 and 138 in the memory 110.

The processing circuit 112 also has stored, in the memory 110, an identification of the space 132, 134, 136 and 138 in which each of the server computers $104_1$ to $104_{18}$ is located.

In this embodiment, the processing circuit 112 allocates processing tasks (applications) to the server computers $104_1$ to $104_{18}$ based at least in part on the suitability index of their corresponding spaces 132, 134, 136 and 138. If a large amount of applications must be assigned to servers, the processing circuit 112 preferably assigns more of the applications to spaces having a higher suitability index, and fewer of the applications to spaces having a lower suitability index. As a result, applications are routed more heavily to server computers located in an environment that is more conducive to accepting the additional thermal load that will result from the addition computational operations.

Figure 2:
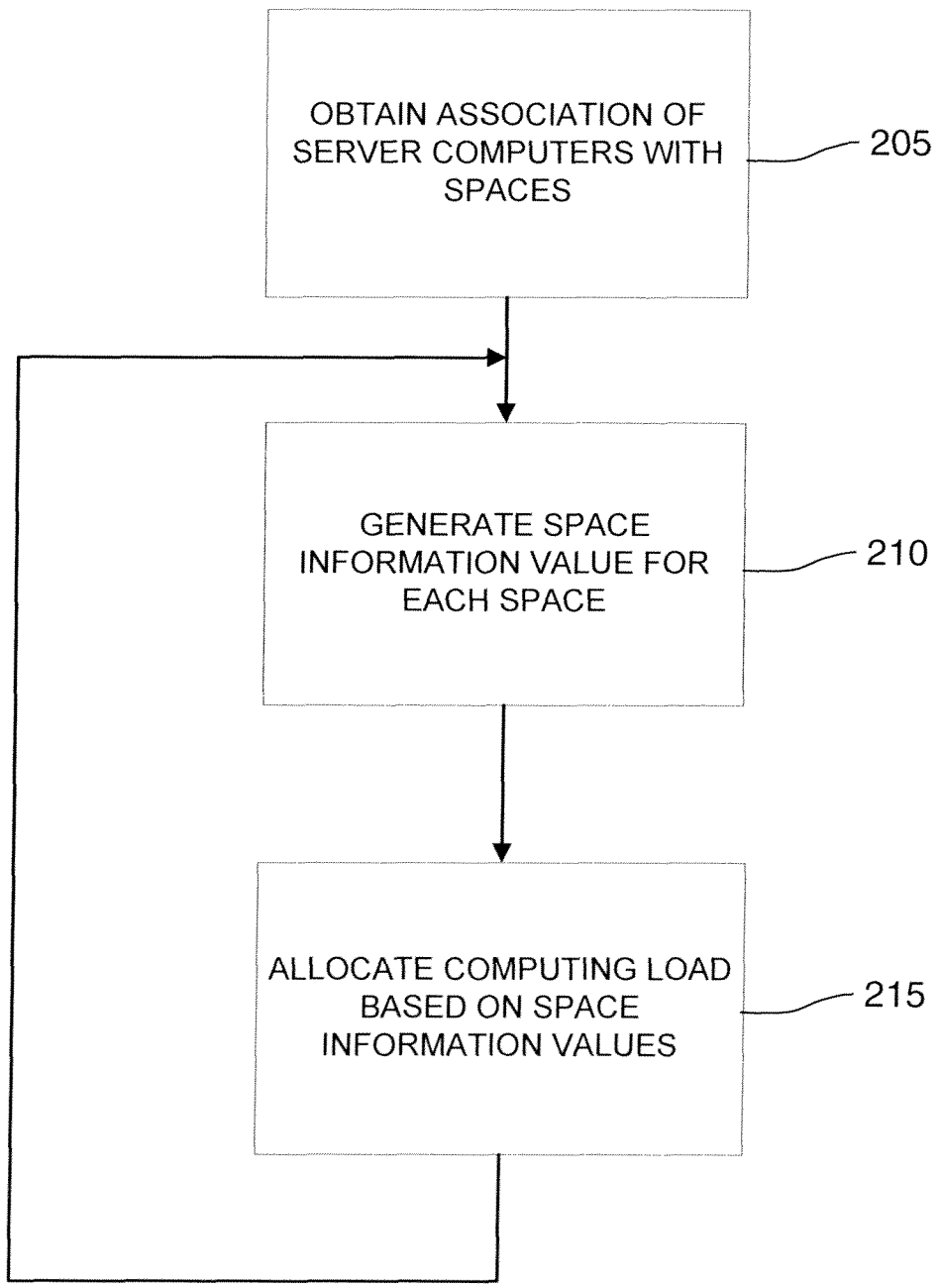
FIG. 2 shows an exemplary set of operations that may be carried in accordance with the present invention.

FIG. 2 shows an exemplary set of operations that may be performed by the processing circuit 140 and the processing circuit 112 to carry out the space suitability based allocation of processing tasks described above. It will be noted that some of these steps may alternatively be carried out by either the processing circuit 112 or the processing circuit 104.

Referring to FIG. 2, in step 205, the processing circuit 140 obtains or generates an association of each server computer $104_n$ with one of the defined spaces 132, 134, 136 and 138. As discussed above, each of the spaces 132, 134, 136 and 138 in this example correspond directly to a single respective rack 122, 124, 126 and 128 and a single respective air conditioning unit $106_1$, $106_2$, $106_3$, $106_4$. However, it will be appreciated that multiple racks (each having multiple computers) may be located in a single space. Alternatively (and preferably), each rack may be subdivided into multiple "spaces". To this end, with the advent of wireless sensor modules, such as those using MEMS devices, multiple wireless sensors may readily be implemented on different locations of a single server rack. As a result, granular environmental data may be obtained that further assists in finding localized hot spots or cool spots associated with particular servers. Similarly, it is not necessary that a single space be associated with a single air conditioning unit.

Indeed, the most significant influence in the meaningful definition of the spaces in a data center is the number and placement of sensors and/or server computers. To this end, so long as a space can be defined by at least one server computer, and has available space-specific environmental information, then a suitability index for such a space can advantageously be generated. For example, at least some embodiments contemplate the placement of at least four temperature sensors on each server rack. In such a case, at least four spaces may be defined for each rack. Using interpolation between sensors, one or more additional spaces may also be defined.

Regardless of how the spaces are defined, however, the processing circuit 140 obtains the association of each server computer with one of the defined spaces. In the exemplary embodiment of FIG. 1, the processing circuit 140 associates the server computers $104_1$, $104_2$, $104_3$, $104_4$, and $104_5$ with the first space 132 of the data center 102, the server computers $104_6$, $104_7$, $104_8$, and $104_9$ with the second space 134, the server computers $104_{10}$, $104_{11}$, $104_{12}$, $104_{13}$, and $104_{14}$ with the third space 136, and the server computers $104_{15}$, $104_{16}$, $104_{17}$, and $104_{18}$ with the fourth space 138.

The processing circuit 140 may suitably obtain the association of servers to defined spaces via user input, directly or indirectly via the BAS element 120. The user input identifies the layout of the server computers $104_1$ to $104_{18}$ with respect to a set of coordinates within the data center 102. The processing circuit 140 (and/or the BAS element 120) may further associate the sensors $118_1$ to $118_4$, as well as the air conditioning units $106_1$ to $106_4$, with the defined spaces 132, 134, 136 and 138.

It will be appreciated, however, that the operations of step 405 may be carried out by the processing circuit 112. Indeed, if the operations of step 405 are carried out by the control circuit 140, the control circuit 140 will communicate the generated space/server correlation information to the processing circuit 112 for later use in step 415.

Thereafter, in step 210, the processing circuit 140 generates a space information value for each space 132, 134, 136 and 138. The space information value includes a suitability index for the space. The suitability index takes into account temperature, and preferably, an indication loading of the server computers within the space, an indication of whether there are available server computers in the space, and whether pre-cooling is occurring within the space. Generation of the space information values is discussed in further detail below in connection with FIG. 3. Table 1 below provides exemplary space information values for the spaces 132, 134, 136 and 138 in tabular form.

TABLE 1

| SPACE | AVAIL | SUITABILITY |
|---|---|---|
| 132 | Yes | 30 |
| 134 | Yes | 90 |
| 136 | No | 0 |
| 138 | Yes | 100 |

Again, the processing circuit 140 provides the space information values to the processing circuit 112. Alternatively, the processing circuit 140 provides sensor values to the processing circuit 112 and the processing circuit 112 determines the space information values.

In step 215, the processing circuit 112 then assigns applications to select ones of the server computers $104_1$ to $104_{18}$ based on the space information value. By way of example, the processing circuit 112 may suitably assign one or a few applications to server computers within the space having the highest suitability index. In the above example of Table 1, the processing circuit 112 would assign a new application to a server within the space 138. If there are multiple available servers within the selected space, as in the case of the space 138, the virtualization software 114 of the computer server management system 108 may suitably identify the specific server(s) in the determined suitable space to which the application(s) should be assigned. If granular temperature measurements are available within the defined space, the processing circuit 112 may attempt to assign the new application to a server closest to a sensor showing a low localized temperature.

If, on the other hand, a large number of applications must be assigned, then the processing circuit may allocate the applications to spaces in a manner proportional to the suitability index of the spaces. Referring to the example of Table 1, therefore, if one-hundred applications are to be assigned, then the processing circuit 112 may suitably assign 30/220 or 14 applications to server computers $104_1$ to $104_5$ within the space 132, assign 90/220 or 41 applications to server computers $104_6$ to $104_9$ within the space 134, and assign 100/220 or 45 applications to server computers $104_{10}$ to $104_{14}$ within the space 136. Similar to above, the virtualization software of the computer server management system 108 may suitably identify the specific server(s) in the determined space to which the identified application(s) should be assigned. Thus, for example, the virtualization software of the computer server management system 108 would identify how the fourteen applications are to be divided among the server computers $104_1$, $104_2$, $104_3$, $104_4$, $104_5$, and so forth.

Accordingly, the operations of FIG. 2 show how the processing circuits 112, 140 obtain suitability index information for defined spaces in a data center, and use the suitability index information to assign application tasks to server computers located within those spaces. Using this process, computational load is advantageously directed to servers in locations having the best conditions for handling new thermal load.

Figure 3:
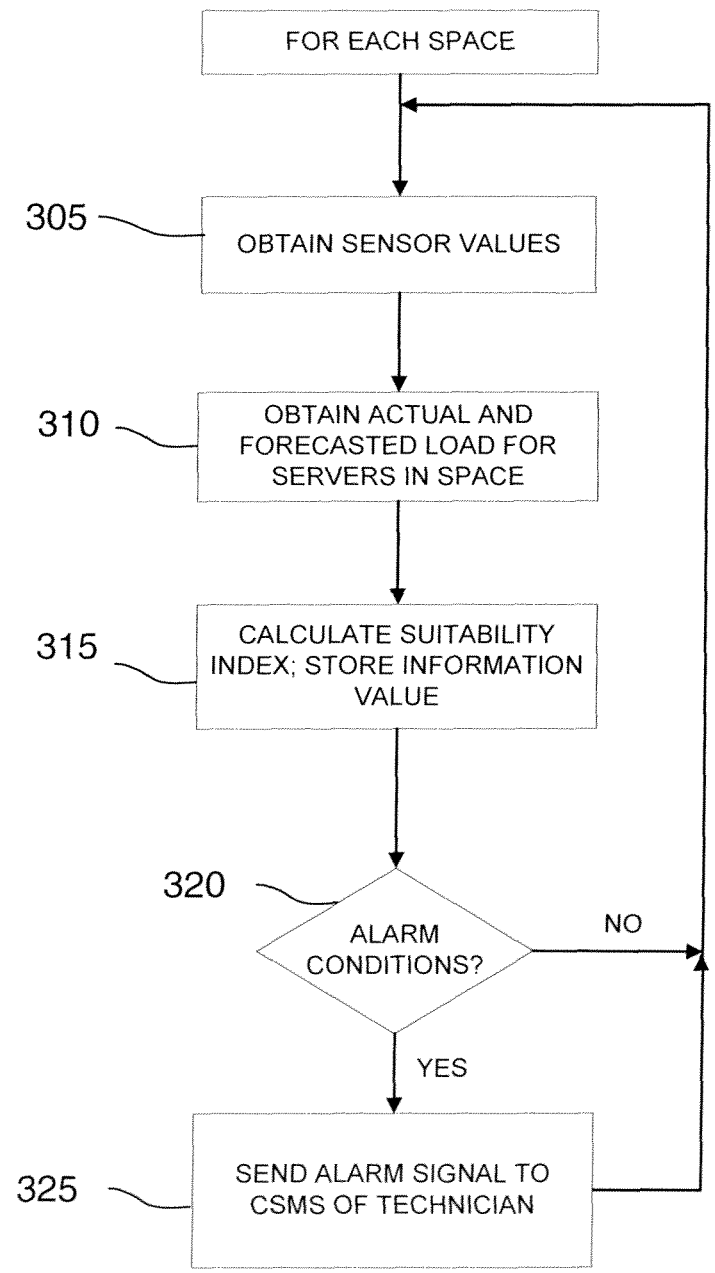
FIG. 3 shows in further detail an exemplary embodiment of at least one of the operations of FIG. 2.

FIG. 3 shows an exemplary set of steps that may be used to generate the suitability index for each defined space in a data center. The steps of FIG. 3 should be carried out periodically, such as daily, hourly or every minute. While the steps of FIG. 3 are discussed as being performed by the processing circuit 140 of the BAS element 120, some or all of the steps may be modified so that they can be performed by the processing circuit 112.

In step 305, the processing circuit 140 obtains sensor values for the given space from the sensors $118_1$ to $118_4$ via a wireless or wired building automation system data network. In the embodiment described herein, the sensor values will typically at least include temperature information for the corresponding space. It will be appreciated that the BAS element 120 or another device may alter, filter, average, or otherwise process the sensor values before calculating the space information values.

In step 310, the processing circuit 140 obtains the actual and forecasted loads for server computers within the selected space. Such information is provided by the computer server management system 108.

In step 315, the processing circuit 140 calculates a suitability index for the space based on the information obtained in steps 305 and 310. The suitability index is a function of the measured temperature, a calculated server load ratio, forecasted server load, pre-cool status and other environmental conditions (pressure, humidity, air flow) in this embodiment. More or less factors may be considered by those of ordinary skill in the art in other implementations. The suitability index (space information value) is provided to the processing circuit 112.

With regard to measured temperature, the suitability index increases inversely as a function of the measured temperature(s) within a space. For example, all other things being equal, it is desirable to assign new applications to server computers in the coolest space.

With regard to server load ratio, the suitability index also rises inversely as a function of the current loading of the server computers within a space. All things (such as temperature) being equal, it is desirable to avoid attempting to assign an application wherein the server computers are all (or mostly) busy and not available.

With regard to predicted server load, suitability index rises inversely as a function of predicted server load within the space. If a server within the defined space is predicted to have a high load that cannot easily be moved to other servers, then it may be advantageous to avoid excessive heat that could result from assigning other new applications to servers in that space.

With regard to pre-cool, suitability index rises as a function of pre-cool status. A pre-cool status is one in which a particular space is being pre-cooled, typically in anticipation of an incoming heavy processing load. If the space is undergoing pre-cool, then it is advantageous to allocate additional computational load to the servers within that space.

With regard to other environmental measurements (humidity, etc.), suitability index increases as those values tend toward optimums, and decreases as those values tend toward unacceptable conditions. Notably, any unacceptable (i.e. alarm) conditions can cause the suitability index to drop to zero, regardless of other factors.

Once the suitability index for the space has been calculated and communicated to the computer server management system 108, the processing circuit 140 proceeds to step 320. In step 320, the processing circuit 140 determines whether the suitability index indicates an alarm condition. For example, a suitability index of zero may be treated as an alarm condition. If an alarm condition is detected, then the processing circuit 140 in step 325 signals the alarm to a visual display, or to a technician's portable wireless device via e-mail, text messaging, or paging. After step 325, the processing circuit 140 returns to step 305 to begin calculations of the suitability index on another space. Similarly, if no alarm condition is detected in step 320, the processing circuit 140 returns directly to step 305.

Thus, the embodiments described above generate an index value indicative of how easily additional computational load may be taken on by server computers within a local space. In some embodiments, suitability indices from multiple data centers may be employed. In such a case, the computer server management system 108 may determine that application processes should allocated to another data center if the local data center (e.g. data center 102) has no space with a relatively good suitability index.

Moreover, it is to be understood that the decision to allocate processing tasks or computational load to particular server computers need not be based solely on the suitability index. Other factors, such as whether local or other data centers can operate using green or renewable energy sources may be considered in the allocation of computational task. For example, the computer server management system 108 may allocate computational load to another data center if that data center has available and can utilize renewable energy sources to a greater extent than the local data center.

In all of the above embodiments, it can be seen that information and data is advantageously shared between the building automation system infrastructure (e.g. the building HVAC system) and the device that manages the assignment of applications with the data center (the computer server management system 108).

Figure 4:
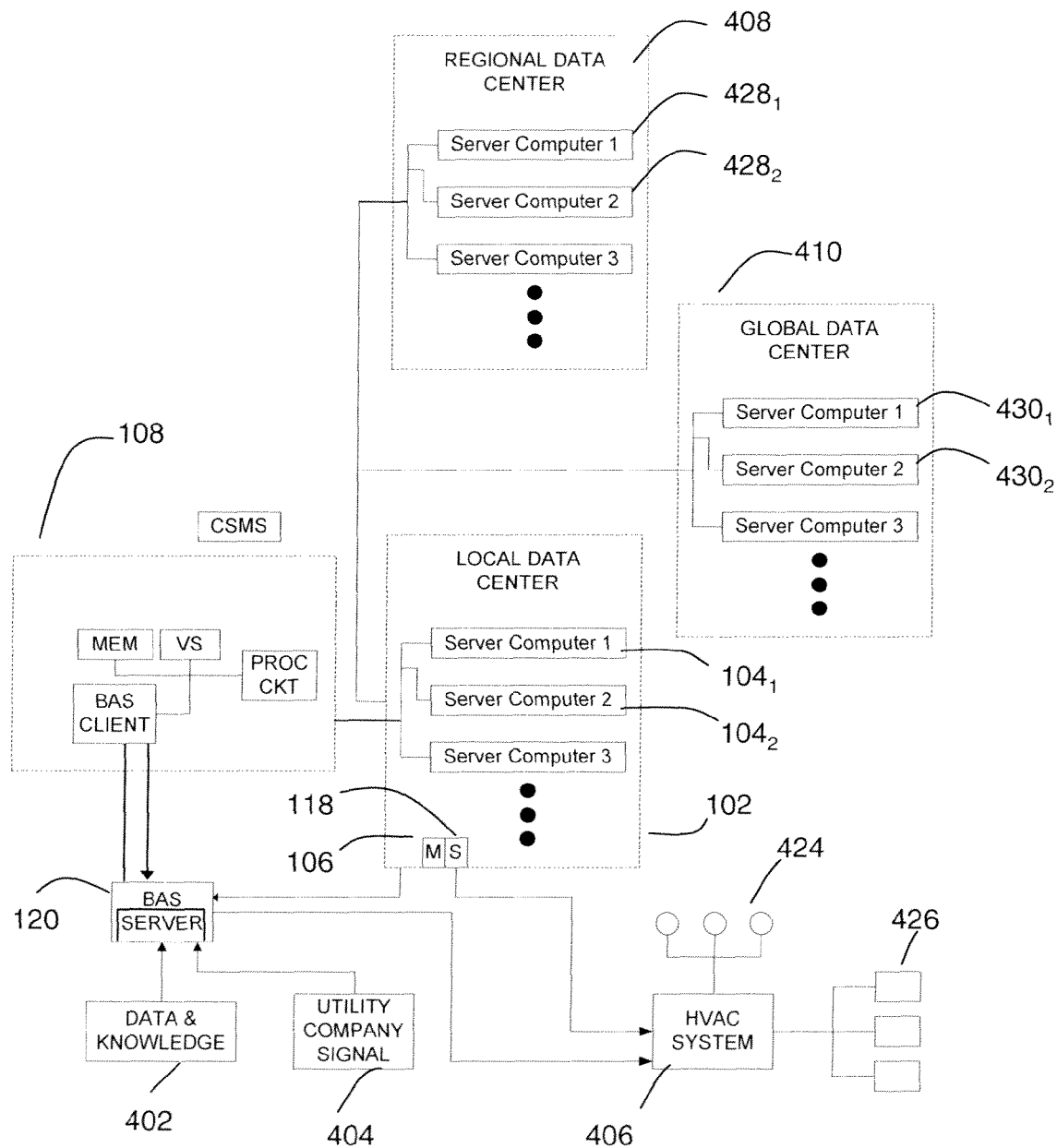
FIG. 4 shows a block diagram of a representation of an arrangement according to some embodiments of the invention that utilize interaction between the BAS infrastructure and the server management infrastructure to improve server management efficiency.

FIG. 4 shows a block diagram of a representation of an arrangement according to some embodiments of the invention that utilize interaction between the BAS infrastructure and the server management infrastructure to improve server management and/or BAS efficiency. Elements of FIG. 1 that are common with FIG. 4 have like reference numbers.

The arrangement of FIG. 4 includes an exemplary embodiment of the computer server management system 108 of FIG. 1, as well as a BAS element 120 in the form of a BAS control station 120, and the data center 102. The arrangement of FIG. 4 further includes a BAS data store 402, a utility company signal input 404, an HVAC system 406, a regional data center 408 and a global data center 410. In general, the computer server management system 108, the local data center 102, the regional data center 408 and the global data center 410 are part of a comprehensive and geographical dispersed data center operation 420. By contrast, the BAS control station 120, the data store 402 and the HVAC system 406 constitute part of a building automation system (or BAS) 422 that may suitably be installed in the same building or campus as at least the local data center 102.

The local data center 102 includes a plurality of server computers $104_1$, $104_2$, etc. and may suitably have the architecture as that of the data center 102 of FIG. 1, as well as any other suitable data center architecture. The regional data center 408 is another data center that includes server computers $428_1$, $428_2$, etc., and which is located remotely at another site. The global data center 410 is yet another data center that includes server computers $430_1$, $430_2$, etc., and which is located even more remotely, such as in a different country or different continent. The data center operation 420 may include any number of such local, regional or global data centers.

The computer server management system (CSMS) 108 in this embodiment includes the memory 110, processing circuit 112, and the virtualization software 114 of FIG. 1, as well as a BAS client 412. The memory 110 stores program code, databases, and working data of the processing circuit 112. The processing circuit 112 is any suitable processing circuit of a commercially available CSMS. In general, the processing circuit 112 executes the virtualization software 114 to allocate computing task requests from clients, not shown, to any of the server computers in the local, regional or global data centers 102, 408, 410. At least some of the embodiments described herein are used to influence the existing computer task allocation operations of the virtualization software 114. As will be discussed below in further detail, the BAS client 412 is a software configuration that accesses portals to BAS data management system in order to exchange data with the BAS 422.

In the embodiment described herein, the BAS control station 120 is a computer work station that includes a BAS data server that provides access to data of the BAS 422. To this end, it is known in the art that sophisticated BAS systems provide access points to data in the BAS system. This access is typically used for remote monitoring and control of BAS functions (HVAC, fire safety, security, etc.). For example the INSIGHT™ work station available from Siemens Building Technologies, Inc. can be configured as a data server to allow client devices access to BAS data. Accordingly, the control station 120 may suitably by an INSIGHT™ work station.

In any event, the BAS client 412 of the CSMS 108 is configured to communicate with the data server of the BAS control station 120. In this configuration, the processing circuit 112 of the CSMS 108 can obtain data generated by elements of the BAS 422, and the control station 120 can obtain data generated by elements of the data center operations 420.

The data store 402 may suitably be data storage elements that store configuration and archival data for the BAS. Such functions and operations are known in the BAS art. The utility company signal input 404 is a logical connection from the BAS control station 120 to a source of data generated by the utility regarding load forecast, load management, and even energy source availability (i.e. whether renewable energy is available).

The HVAC system 406 is a comprehensive heating, cooling and ventilation system that provides environmental controls within a building or campus of buildings. As is known in the art, the HVAC system 406 includes a number of sensors 424 and actuators 426 that are used to monitor and control different aspects of the building environment such as temperature and fresh air ventilation. To this end, the HVAC system 406 will also include mechanical elements such as chillers, air handling units, ventilation dampers, and ventilation fans and ducts, and so forth. In this embodiment, the HVAC system 406 also includes sensors 118 disposed within the data center 102, and one or more computer room air conditioning units 106 disposed within the data center 102.

As discussed above, the BAS 422 and the data center operations 420 share information via an interface, which in this embodiment is carried out by the BAS client 412 of the CSMS 108 and the BAS data server of the BAS control station 120. As will be discussed below, the sharing of data between the two systems can be used to more efficiently allocate computing tasks among the server computers $104_1$, $104_2$, $428_1$, $428_2$, $430_1$, $430_2$, etc. The efficiencies may involve coordinating with the HVAC system 406 to more efficiently operate ACUs 106 within the data center 102, to more efficiently utilize renewable energy resources, among other things. Examples of methods of sharing data and control between a BAS 422 and a data center operation 420 are discussed below. It will be appreciated that the processing required in each of these methods may be carried out by the processing circuit 112, the processing circuit (e.g. processing circuit 140) of the BAS control station 120, a combination of both, or in part by other processing devices in either system 420, 422.

As discussed above, one feature of this arrangement of FIGS. 1 and 4 is that the BAS 422 can communicate detailed data center environmental data to the CSMS 108 and the virtualization software 114. This detailed data center environmental data can be used to influence computing load allocations. As discussed above in connection with FIGS. 1 and 2, many wireless sensors 118 can be implemented in the data center 102 to provide comprehensive data regarding the temperature, humidity, air flow and pressure, as well as things like the present of noxious gasses and the like. This can be accomplished with a multi-dimensional array of microelectromechanical (MEMs) based wireless sensors 118.

Another feature is that the BAS 422 and data center operation 420 can share data to accommodate an equipment malfunction in the BAS 422, such as, for example, a partial or complete malfunction of an ACU. In particular, the BAS 422 can communicate information identifying the need for the CSMS 108 to move applications away from servers that are thermally proximate to the malfunctioning ACU 106. If an issue affects the entire data center 102, then the CSMS 108 can move applications to regional or global data centers 408 and 410.

Another feature is that user interface displays (e.g. in the BAS control station 120) may incorporate graphical displays of environmental conditions of the spaces of the data center 102, particularly in the context of the location of the servers of the data center 102. The computational loading of the servers may also be depicted simultaneously, such that an intuitive view of the thermal stress and computer loading concentrations within the data center 102 is provided. For example, such a graphic display may include a two or three dimensional map of showing relative positions of the servers, having a thermal concentration overlay (similar to a isothermic map) as well as an indication of the concentration of computational load on each server shown in the map.

The BAS control station 120 may also communicate useful data derived from utility load management, price, or source information, as well as weather information to the CSMS 108. The CSMS 108 can make informed decisions about whether to move a significant amount of computer load from the local data center 102 to the remote data centers 408 and 410, or vice versa, based on derived data received from the BAS 120. The BAS 120 may suitably derive the data by folding appropriate adjustments to space suitability values based on the utility load management, price and/or energy source information. Thus, for example, if the utility company input 404 receives information that the building in which the data center 102 has a relatively high amount of renewable energy available, then the BAS 120 provides data to the CSMS 108 that the CSMS 108 uses to evaluate whether to move computing load from the data center 408 into the data center 102 to increase the usage of the renewable energy. In another example, if the BAS control station 120 obtains weather data indicating that the day will be very cold, the BAS control station 120 may also cooperate with the CSMS 108 to otherwise move data center operations around to portions of building that require heat. The BAS control station 120 may further include mechanical devices to convey heat from the data center 102 to other portions of the building requiring heat.

The environmental sensor data from the sensors 118 can also provide information about how the data center 102 might be physically reconfigured to create a better thermal loading profile. Sensor data may be analyzed to identify hot spots or cold spots, and such information could be used to identify problems to be corrected. In addition, such information can be used to identify potential locations for new server equipment and/or ACU equipment.

Another feature of sharing data between the data center operation 420 and the BAS 422 is that alarms in the BAS 422 may efficiently communicated to data center personnel via the CSMS 108 interface. This includes screens, displays, alert messages and human interaction sequences specifically designed for the data center human machine interfaces. This includes using computer web browsers, cell phones and personal digital assistants.

Accordingly, the architecture of FIGS. 1 and 4 can provide significant efficiencies that do not necessarily involve the operations of FIGS. 2 and 3, although such operations provide their own efficiencies. In any event, it will appreciated that the above-described embodiments are merely exemplary, and that those of ordinary skill in the art may readily devise their own implementations and embodiments that incorporate the principles of the invention and fall within the spirit and scope thereof.

We claim:

1. An arrangement, comprising
a computer server management system configured to coordinate usage of a plurality of server computers, the computer server management system executing virtualization software configured to manage application processing on the plurality of server computers located in at least one data center;
a building automation system (BAS) data management station, the BAS data management station operably coupled to controllers, sensors and actuators of a building environmental control system;
a data interface between the BAS data management station and the computer server management system;
wherein the BAS data management station is configured to provide space suitability values for spaces within a first data center via the data interface to the computer server management data system, the space suitability values derived as a function of measured temperature, server load information, utility load management information, and a pre-cooling status of the BAS; and
wherein the computer server management data system is configured to provide loading information for the plurality of server computers via the data interface to the BAS data management station, and wherein the computer server management system is configured manage the application processing on the plurality of server computers based on the space suitability values.

2. The arrangement of claim 1 wherein the BAS data management station is further configured to provide data regarding a change in an ability of the building automation control station to alter the environment of at least one space of the first one of the at least one data center.

3. The arrangement of claim 1, further comprising a human machine interface device configured to convey graphical information depicting data regarding environmental conditions within the first of the at least one data center, and data regarding computation loading information for servers in the data center.

4. The arrangement of claim 1, wherein the computer server management system is configured to coordinate the usage of the plurality of server computers based on the data regarding environmental conditions of spaces within the first of the at least one data center.

5. The arrangement of claim 4, wherein the BAS data management system is operably connected to receive utility rate information, and wherein
the BAS data management system is configured to provide utility-based information derived from the received utility rate information to the computer server management system; and
the computer server management system is configured to coordinate the usage of the plurality of server computers based at least in part on the utility-based information.

6. The arrangement of claim 4, wherein:
BAS data management system is operably connected to a source of weather forecasting data;
the BAS data management system is further configured to alter the operation of the building environmental control system based on the weather data; and
the computer server management system is configured to coordinate the usage of the plurality of server computers based at least in part on information derived from the weather forecasting data.

7. The arrangement of claim 6, wherein the BAS data management system and the computer server management system cooperate to reduce energy consumption based on the weather forecasting data.

8. The arrangement of claim 1, wherein the computer server management system comprises a first processing circuit, and wherein the BAS data management station comprises a second processing circuit.

9. The arrangement of claim 1, wherein the BAS data management station includes a BAS server, and wherein the computer server management system further comprises a BAS client, and wherein the BAS server is configured to provide the at least some data via the data interface to the BAS client of the computer server management data system.

10. An arrangement, comprising
a computer server management system configured to coordinate usage of a plurality of server computers within a data center;
a data management station of a building environmental control system, the data management station operably coupled to controllers, sensors and actuators of the building environmental control system;
a plurality of sensors, the plurality of sensors configured to provide environmental data for a plurality of areas within a data center in which at least some of the plurality of server computers are disposed; and
wherein the data management station is configured to use the environmental data to provide data regarding environmental conditions of spaces corresponding to groups of one or more server computers to the computer management server system, wherein the data center includes pluralities of groups of server computers, wherein said data regarding environmental conditions include space suitability values, the space suitability values derived as a function of measured temperature, server load information, utility load management information, and a pre-cooling status of the BAS; and
wherein the computer server management system is configured to coordinate the usage among the plurality of server computers based on the space suitability values.

11. The arrangement of claim 10, wherein the computer server management system comprises a first processing circuit, and wherein the data management station comprises a second processing circuit.

12. The arrangement of claim 10, wherein the data management station includes a building automation system server, and wherein the computer server management system further comprises a building automation system client.

13. The arrangement of claim 10, wherein the data management system is operably connected to receive utility rate information, and wherein
the data management system is configured to provide utility-based information derived from the received utility rate information to the computer server management system; and
the computer server management system is configured to coordinate the usage of the plurality of server computers based at least in part on the utility-based information.

14. The arrangement of claim 10, wherein:
the data management system is operably connected to a source of weather forecasting data;
the data management system is further configured to alter the operation of the building environmental control system based on the weather data; and
the computer server management system is configured to coordinate the usage of the plurality of server computers based at least in part on information derived from the weather forecasting data.

15. The arrangement of claim 10, wherein the data management system and the computer server management system cooperate to reduce energy consumption based on the weather forecasting data.

* * * * *